(12) United States Patent
Kirkpatrick et al.

(10) Patent No.: US 7,410,890 B2
(45) Date of Patent: *Aug. 12, 2008

(54) FORMATION OF DOPED REGIONS AND/OR ULTRA-SHALLOW JUNCTIONS IN SEMICONDUCTOR MATERIALS BY GAS-CLUSTER ION IRRADIATION

(75) Inventors: Allen R. Kirkpatrick, Carlyle, MA (US); Sean Kirkpatrick, Littleton, MA (US); Martin D. Tabat, Nashua, NH (US); Thomas G. Tetreault, Manchester, NH (US); John O. Borland, South Hamilton, MA (US); John J. Hautala, Beverly, MA (US); Wesley J. Skinner, Andover, MA (US)

(73) Assignee: TEL Epion Inc., Billerica, MA (US)

( * ) Notice: Subject to any disclaimer, the term of this patent is extended or adjusted under 35 U.S.C. 154(b) by 264 days.

This patent is subject to a terminal disclaimer.

(21) Appl. No.: 11/150,698

(22) Filed: Jun. 11, 2005

(65) Prior Publication Data
US 2005/0277246 A1    Dec. 15, 2005

Related U.S. Application Data

(63) Continuation-in-part of application No. PCT/US03/39754, filed on Dec. 12, 2003, and a continuation-in-part of application No. 11/080,800, filed on Mar. 11, 2005, and a continuation-in-part of application No. PCT/US05/08246, filed on Mar. 11, 2005.

(60) Provisional application No. 60/552,505, filed on Mar. 12, 2004, provisional application No. 60/433,866, filed on Dec. 12, 2002.

(51) Int. Cl.
*H01L 21/34* (2006.01)

(52) U.S. Cl. .............. 438/510; 438/513; 438/514; 438/515; 438/516; 427/523; 118/723

(58) Field of Classification Search .................. 438/45, 438/513, 514, 515, 516, 535, 659, 798, FOR. 150; 257/E21.466
See application file for complete search history.

(56) References Cited

U.S. PATENT DOCUMENTS

| 5,814,194 A | 9/1998 | Deguchi et al. |
| 6,013,332 A | 1/2000 | Goto et al. |

(Continued)

FOREIGN PATENT DOCUMENTS

| WO | WO2004/053945 | 6/2004 |

OTHER PUBLICATIONS

Isao Yamada, Jiro Matsuo, Noriaki Toyoda and Allen Kirkpatrick, "Materials Proccesing by Gas Cluster Ion Beams", Materials Science and Engineering Reports, vol. 34, Issue 6, pp. 231-295, Oct. 30, 2001 (ISSN 0927-796X).*

(Continued)

*Primary Examiner*—Thanh V Pham
(74) *Attorney, Agent, or Firm*—Burns & Levinson, LLP; Jerry Cohen; David Gomes

(57) ABSTRACT

Method of forming one or more doped regions in a semiconductor substrate and semiconductor junctions formed thereby, using gas cluster ion beams.

52 Claims, 15 Drawing Sheets

U.S. PATENT DOCUMENTS

| | | |
|---|---|---|
| 6,251,835 B1 | 6/2001 | Chu et al. |
| 6,416,820 B1 | 7/2002 | Yamada et al. |
| 6,548,341 B2 | 4/2003 | Sarstedt |
| 6,805,807 B2 * | 10/2004 | Fenner .................. 216/38 |
| 2002/0036261 A1 | 3/2002 | Dykstra |
| 2002/0070361 A1 | 6/2002 | Mack et al. |
| 2003/0109092 A1 | 6/2003 | Choi et al. |
| 2004/0002202 A1 | 1/2004 | Horsky et al. |
| 2004/0157456 A1 * | 8/2004 | Hall et al. .................. 438/692 |
| 2004/0188631 A1 | 9/2004 | Horsky et al. |
| 2006/0043590 A1 * | 3/2006 | Chen et al. .................. 257/752 |
| 2006/0105570 A1 * | 5/2006 | Hautala et al. .............. 438/687 |

OTHER PUBLICATIONS

K Goto, et al, A High Performance 50nm PMOSFET Using Decaborane (B10H14) Ion Implantation And 2-Step Activation Annealing Process, IEDM Tech . Dig., IEEE (1997) 471.

\* cited by examiner

FORMATION OF DOPED REGIONS AND/OR ULTRA-SHALLOW JUNCTIONS IN SEMICONDUCTOR MATERIALS BY GAS-CLUSTER ION IRRADIATION

CROSS-REFERENCE TO RELATED APPLICATIONS

This application is a continuation-in-part application of Patent Cooperation Treaty (PCT) application no. PCT/US03/39754, filed 12 Dec. 2003, which claims the benefit of priority to U.S. provisional application Ser. No. 60/433,866, filed 12 Dec. 2002, and a continuation-in-part application of U.S. patent application Ser. No. 11/080,800 and PCT application no. PCT/US05/08246, each of which was filed 11 Mar. 2005 claiming the benefit of priority to U.S. provisional patent application Ser. No. 60/552,505, the contents of all of the aforementioned applications being hereby incorporated by reference as if laid out in their entirety.

FIELD OF THE INVENTION

This invention relates generally to the doping and activation of semiconductor substrates. More particularly, it relates to the formation of ultra-shallow semiconductor junctions and to the impurity doping of semiconductor surfaces by energetic gas-cluster ion irradiation;

BACKGROUND OF THE INVENTION

The characteristics of semiconductor materials such as silicon, germanium and gallium arsenide and other semiconductors have been exploited to form a large variety of useful devices in the fields of electronics, communications, electro-optics, and nano-technology. Ultra shallow junctions are required for future semiconductor devices. The formation of a shallowly doped semiconductor having an abrupt interface is difficult. Prior art methods have employed ion implantation techniques using very low energy conventional ions. Typical ion implanters suffer from greatly reduced ion beam currents at very low energies and therefore result in a low processing throughput. In efforts to increase the throughput of shallow doping processes, alternative techniques have been developed. These include plasma ion doping and decaborane ion implantation (or similar molecular implants). All these methods require a pre-amorphizing implant to prevent ion channeling of the doping implant species, which would otherwise produce undesirably deep junctions. A pre-amorphizing implant is an ion implantation step done prior to a doping step for the purpose of damaging the region to be doped so as to reduce or eliminate the crystallinity of the region to reduce the degree of channeling of the dopant, which would otherwise result in a dopant depth distribution with an undesirably deep tail due to channeled dopant atoms. Such pre-amorphizing damage implants are often done with inert gases like Ar or Xe or with non-electrically active ion species like Si or Ge. For some semiconductor devices, it is desirable to dope the semiconductor material with, for example, boron at very high doping concentrations. With conventional ion beams, including even molecular ion beams (decaborane, for example) the development of high doping levels using the low beam currents available at the very low ion energies required for shallow junction doping is a low productivity process. Additionally, the solid solubility limit of the dopant in silicon has been an upper limit for effective doping. Prior art indicates that the solid solubility limit of boron in silicon can be increased by introducing germanium atoms to the silicon.

The use of a gas-cluster ion beam (GCIB) for etching, cleaning, and smoothing surfaces is known (see for example, U.S. Pat. No. 5,814,194, Deguchi, et al.) in the art. GCIBs have also been employed for assisting the deposition of films from vaporized carbonaceous materials (see for example, U.S. Pat. No. 6,416,820, Yamada, et al.) For purposes of this discussion, gas-clusters are nano-sized aggregates of materials that are gaseous under conditions of standard temperature and pressure. Such clusters may consist of aggregates of from a few to several thousand (or even tens of thousands) molecules or more, loosely bound to form the cluster. The clusters can be ionized by electron bombardment or other means, permitting them to be formed into directed beams of controllable energy. Such ions each typically carry positive charges of $q \cdot e$ (where e is the magnitude of the electronic charge and q is an integer of from one to several representing the charge state of the cluster ion). The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes ion clusters effective for a variety of surface modification processes, without the tendency to produce deeper subsurface damage and/or dopant channeling that is characteristic of conventional ion beam processing.

Means for creation of and acceleration of such GCIBs are described in the reference (U.S. Pat. No. 5,814,194) previously cited and which is incorporated herein by reference. Presently available ion cluster sources produce clusters ions having a wide distribution of sizes, N, up to N of several thousand, or even tens of thousands, the distribution typically having a mean cluster size $\overline{N}$ at greater than 200, and commonly greater than several thousand (where N=the number of molecules in each cluster—in the case of monatomic gases like argon, an atom of the monatomic gas will be referred to as either an atom or a molecule and an ionized atom of such a monatomic gas will be referred to as either an ionized atom, or a molecular ion, or simply a monomer ion—throughout this discussion).

SUMMARY OF THE INVENTION

It is therefore an object of this invention to provide shallow doping of semiconductor materials by energetic gas-cluster ion irradiation.

It is another object of this invention to provide shallow, abrupt junction, doping of semiconductor materials wherein a pre-amorphizing step is not required.

It is a further object of this invention to provide doping of semiconductors at high dopant concentrations by increasing the solid solubility limit of the dopant species in the semiconductor by incorporating germanium in the semiconductor.

A still further object of this invention is to provide a method of improving a distribution of a dopant in a semiconductor substrate by irradiation with an energetic gas-cluster ion beam.

It is an additional object of this invention to provide a channeling free method of doping a semiconductor that can be electrically activated without the requirement of performing a separate amorphizing step.

It is therefore an object of this invention to provide for re-crystallizing or for improving the crystallinity of a semiconductor surface by energetic gas cluster ion irradiation.

It is another object of this invention to provide for the activation of shallowly implanted dopant atoms in a semiconductor material with reduced redistribution of the dopant atoms by diffusion induced by the activation by utilizing energetic gas-cluster ions for the activation.

A still further object of this invention is to provide for the production of an ultra-shallow junction by the introduction of dopant atoms in the ultra-shallow sub-surface regions of a semiconductor material and for the activation of the dopant and for re-crystallizing or for improving the crystallinity of the semiconductor surface by irradiation of energetic gas-cluster ions comprising dopant atoms or comprising dopant and inert atoms.

The objects set forth above as well as further and other objects and advantages of the present invention are achieved by the embodiments of the invention described hereinbelow.

Upon impact of an energetic gas-cluster on the surface of a solid target, penetration of the atoms of the cluster into the target surface is typically very shallow because the penetration depth is limited by the low energy of each individual constituent atom and depends principally on a transient thermal effect that occurs during the gas-cluster ion impact. Gas-clusters dissociate upon impact and the individual gas atoms then become free to recoil and possibly escape from the surface of the target. Other than energy carried away by the escaping individual gas atoms, the total energy of the energetic cluster prior to impact becomes deposited into the impact zone on the target surface. The dimensions of a target impact zone are dependent on approximately the cube root of the cluster energy (as opposed to the linear dependence on energy in conventional ion implantation) and range from a few tens of angstroms to a few hundreds of angstroms for cluster acceleration potentials of 40 kV and below for an ionic cluster comprised of 1000 atoms. Because of the deposition of most of the total energy carried by each cluster ion into a small impact zone on the target, an intense thermal transient occurs within the target material at the cluster ion impact site. The thermal transient dissipates quickly as energy is lost from the impact zone by conduction deeper into the target. Duration of the thermal transient is determined by the conductivity of the target material but will typically be less than $10^{-6}$ second.

Near a cluster impact site, a volume of the target surface can momentarily reach temperatures of many hundreds to several thousands of degrees Kelvin. As an example, impact of a cluster carrying 10 keV total energy is estimated to be capable of producing a momentary temperature increase of about 2000 degrees Kelvin throughout a highly agitated, approximately hemispherical zone extending to about 100 Angstroms below a silicon surface.

Following initiation of an elevated temperature transient within the target volume below an energetic cluster impact site, the affected zone cools rapidly. Some of the cluster constituents escape during this process, while others remain behind and become incorporated in the surface. A portion of the original surface material may also be removed by sputtering or like effects. In general, the more volatile and inert constituents of the cluster are more likely to escape, while the less volatile and/or more chemically reactive constituents are more likely to become incorporated into the surface and a shallow sub-surface region. Although the actual process is likely much more complex, it is convenient to think of the cluster impact site and the surrounded affected zone as a "melt zone" wherein the cluster atoms may briefly interact and mix with the substrate surface and wherein the cluster materials either escape the surface or become infused into the surface to the depth of the affected zone. The term "infusion" or "infusing" is used by the inventors to refer to this process to distinguish it from ion "implantation" or "implanting", a very different process that produces very different results. Unlike conventional ion implantation, GCIB infusion does not introduce significant amounts of energy into the bulk of the processed substrate and thus is an essentially room temperature process that does not result in any significant heating of the substrate (other than the highly localized effects at the cluster impact sites).

If a damaged crystal lattice condition, such as that caused by ion implantation of dopant atoms, exists within a layer near the target surface, the transient temperature conditions produced by energetic cluster impact can be employed to cause recovery of the damaged lattice. For this to occur, a sufficient thermal transient must be created in a volume extending through the damaged region to the undamaged silicon crystal below. During dissipation of the transient temperature conditions, cooling must proceed from the undamaged crystal lattice below the damaged layer back through the damage layer to the surface. Upon restoration or partial restoration of the crystal lattice within the damaged region, dopant atoms will become incorporated into lattice sites and electrical activation will occur.

Noble gases in the energetic cluster ion, such as argon and xenon, for example, being volatile and non-reactive have a high probability of escape from the affected zone, while materials such as boron, germanium, and silicon, for example, being less volatile and more likely to form chemical bonds, are more likely to remain in the affected zone, becoming incorporated in the surface of the substrate. If a gas containing an appropriate semiconductor dopant atom such as boron is added to, or used as, the gas to form the energetic gas-clusters, the energetic gas-cluster impact can deposit dopant atoms into a semiconductor lattice and simultaneously produce recovery or partial recovery of any damage to the lattice.

Inert gases such as, for example, noble inert gases argon and xenon, can be mixed with gases containing elements that form semiconductors, germanium or silicon, for example, and/or with gases that contain elements that act as dopants (dopants are elements that, when introduced into a pure semiconductor material, act as electron donors or acceptors for modifying the electrical characteristics of the semiconductor material) for semiconductor materials, boron, phosphorous and arsenic, for example, to form compound gas-clusters containing different selected elements. Such clusters can be formed with existing gas-cluster ion beam processing equipment as will be described hereinafter, by using suitable source gas mixtures as the source gas for gas-cluster ion beam generation, or by feeding two or more gases (or gas mixtures) into the gas-cluster ion generating source and allowing them to mix in the source. Germanium-containing gases such as germane ($GeH_4$) or germanium tetrafluoride ($GeF_4$), for example, may be employed for incorporating germanium into gas-clusters. Silicon-containing gases such as silane ($SiH_4$) and silicon tetrafluoride ($SiF_4$), for example, may be employed for incorporating silicon into gas-clusters. Dopant-containing gases such as diborane ($B_2H_6$), boron trifluoride ($BF_3$), phosphine ($PH_3$), phosphorous pentafluoride ($PF_5$), arsine ($AsH_3$), arsenic pentafluoride ($AsF_5$), as examples, may be employed for incorporating dopant atoms into gas-clusters. For example, argon and germane can be mixed to make a source gas for forming clusters for infusing germanium. As another example, argon and diborane can be mixed to form a source gas for forming clusters containing boron for infusing boron. As still another example, argon, diborane, and germane can be mixed to form a source gas for forming clusters containing both boron and germanium atoms for infusing both boron and germanium.

For some semiconductor products, an important requirement for the introduction of dopants into the semiconductor surface or for the formations of films is that the maximum depth to which the dopant has been introduced be rather shallow, on the order of several tens of angstroms to a few hundred angstroms. Gas-cluster ion beams are particularly suited for shallow doping because, while the gas-cluster ions may be accelerated to several kilo-electron volts (or even several tens of kilo-electron volts) of energy, because the clusters typically consist of thousands of atoms, individual atoms have little energy and do not ballistically penetrate the irradiated surface to great depths as occurs in conventional ion implantation and other monomer ion processes. The depth of the effects produced by energetic gas-cluster impact can be controlled by controlling the energy of the gas-cluster and, through such control, films of 100 angstroms or even less can be formed and/or processed. In addition, it is noted that gas-cluster ion beams are very efficient at infusing cluster constituents into the surfaces they irradiate. Conventional ion beams typically implant one or at most a few atoms per ion. In the case of a GCIB, the efficiency is much higher. As an example, a gas-cluster ion beam formed of clusters formed from a mixture of 5% germane in argon will typically incorporate from 100 to 2000 germanium atoms per gas-cluster ion into the irradiated surface, the exact number being controllably and repeatably dependent on beam parameters. The infused films tend to be amorphous or polycrystalline, but they can be converted to crystalline films by applying a thermal annealing step (e.g., at a temperature at or below 600 C), either a rapid anneal or a furnace anneal, preferably a non-diffusing or low-diffusing anneal. If needed to optimize anneal conditions a post-infusion-amorphization step can be done by conventional ion implantation, or by GCIB infusion of, for example, germanium by employing germanium-containing energetic gas-cluster ions. With suitable clusters containing both a dopant (boron for example) and an amorphizing agent (germanium for example) a single GCIB infusion step can produce a very shallow doped and amorphized layer that can be annealed and activated without a separate amorphizing step. When GCIB infusion of both boron and germanium is performed in a silicon substrate, the presence of the germanium can also serve to increase the solid solubility of the boron in the silicon, permitting higher boron doping levels.

Inert gas gas-cluster ion beam processing of a GCIB infusion doped semiconductor can be used to improve the depth-distribution profile of the dopant when it is desired to flatten the profile peak while yet retaining a shallow, abrupt depth-distribution tail.

BRIEF DESCRIPTION OF THE FIGURES

For a better understanding of the present invention, together with other and further objects thereof, reference is made to the accompanying drawing and detailed description, wherein.

DETAILED DESCRIPTION OF THE INVENTION

Figure 1:
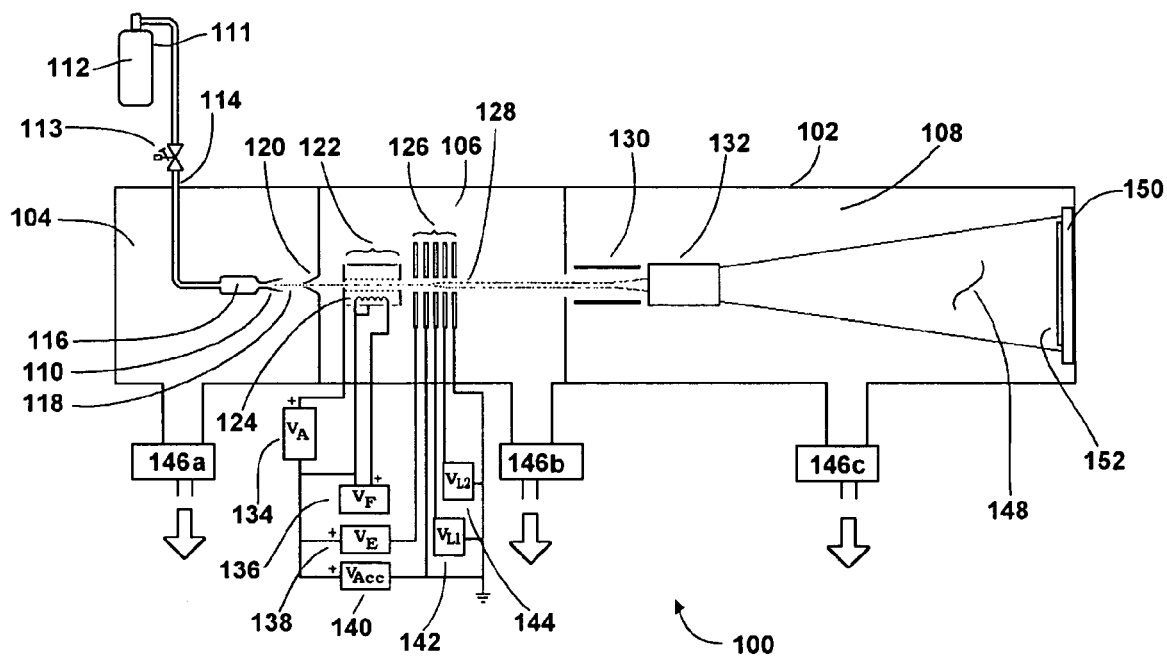
FIG. 1 is a schematic showing the basic elements of a prior art GCIB processing apparatus that uses an electrostatically scanned beam.

FIG. 1 shows a schematic of the basic elements of a prior art configuration for a processing apparatus 100 for generating a GCIB in accordance with the present invention. Apparatus 100 may be described as follows: a vacuum (reduced-pressure) vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired mean energy (typically from 1 keV to several tens of keV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. $V_{Acc}$ is typically adjustable and controllable, having a typical range of from a few hundred volts to as much as several tens of kV or even as much as 100 kV. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
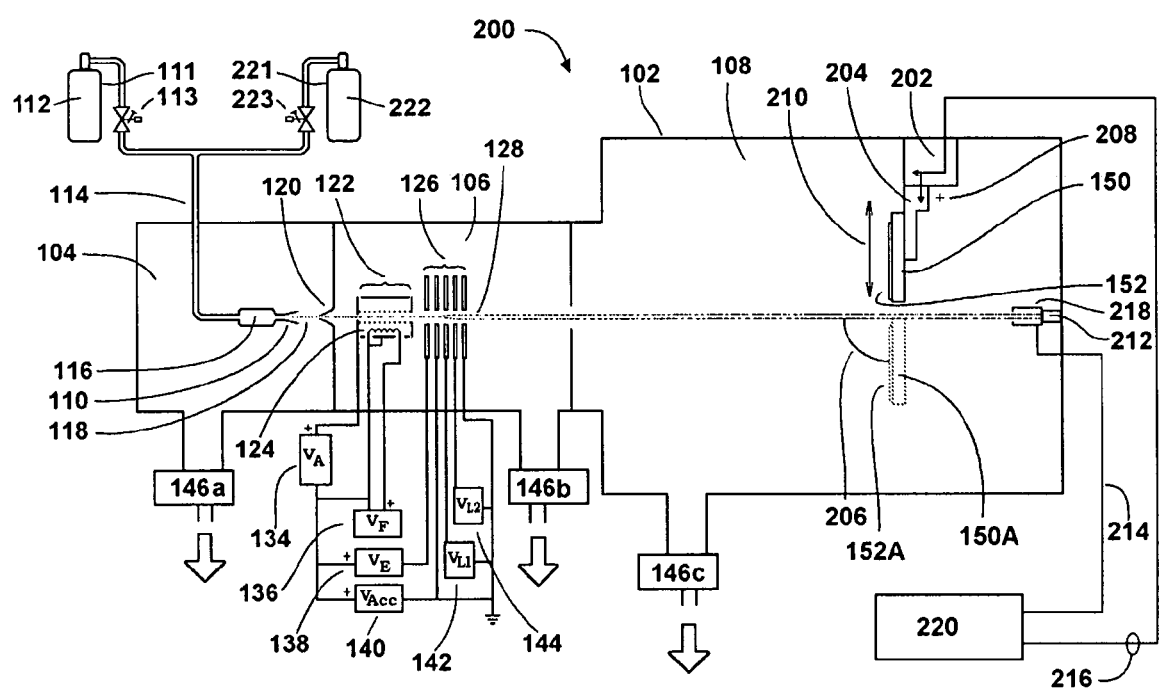
FIG. 2 is a schematic showing the basic elements of a prior art GCIB processing apparatus that uses a stationary beam with mechanical scanning of the workpiece and that includes provision for mixing source gases.

FIG. 2 shows a schematic of the basic elements of a prior art mechanically scanning GCIB processing apparatus 200 for generating a GCIB in accordance with the present invention. Apparatus 200 may be described as having a stationary beam with a mechanically scanned workpiece 152, and having a conventional faraday cup for beam measurement and a conventional thermionic neutralizer. GCIB formation is similar to as shown in FIG. 1, except there is additional provision for an optional second source gas 222 (typically different from the source gas 112) stored in a gas storage cylinder 221 with a gas metering valve 223 and connecting through gas feed tube 114 into stagnation chamber 116. Although not shown, it will be readily appreciated by those of skill in the art that three or more source gases can easily be arranged for by adding additional gas storage cylinders, plumbing, and valves. This multiple gas arrangement allows for controllably selecting between two differing source gasses 112 and 222 or for controllably forming a mixture of two (or more) source gasses for use in forming gas-clusters. It is further understood that the source gases, 112, and 222, may themselves be mixtures of gases, for examples argon plus 1% diborane, or argon plus 5% germane. In addition, in the mechanically scanning GCIB processing apparatus 200 of FIG. 2, the GCIB 128 is stationary (not electrostatically scanned as in the GCIB processing apparatus 100) and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or near 90 degrees. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (overscanned). Though not shown explicitly in FIG. 2, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 3:
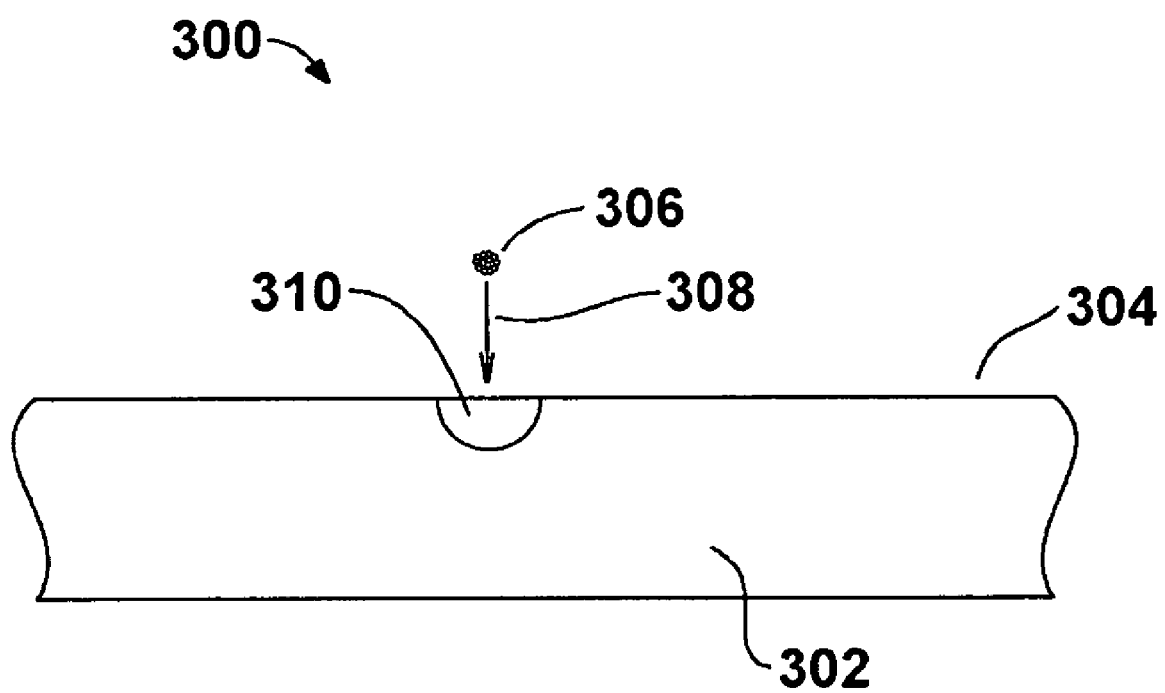
FIG. 3 is a schematic of a portion of a semiconductor wafer receiving s-cluster ion irradiation.

FIG. 3 is an illustration of a surface region 300 of a portion of a semiconductor wafer 302 being impacted by a gas-cluster ion 306 comprising a mixture of noble gas and other gas molecules. The figure is not drawn to scale. The semiconductor wafer 302 has a surface 304 and is, for example, a single crystal material and may be at any of several stages of processing for fabricating an integrated circuit or semiconductor device. A gas-cluster ion 306 having a trajectory 308 is shown impacting surface 304 of semiconductor wafer 302, where it forms a gas-cluster ion-impact region 310. According to an embodiment of the invention, gas-cluster ion 306 has been formed so that it is a cluster that includes dopant atom species and/or a species to promote increased amorphization or to improve dopant solubility (germanium for example). For example, the cluster might include diborane, germane, and/or other species in addition to a noble gas such as argon.

Figure 4:
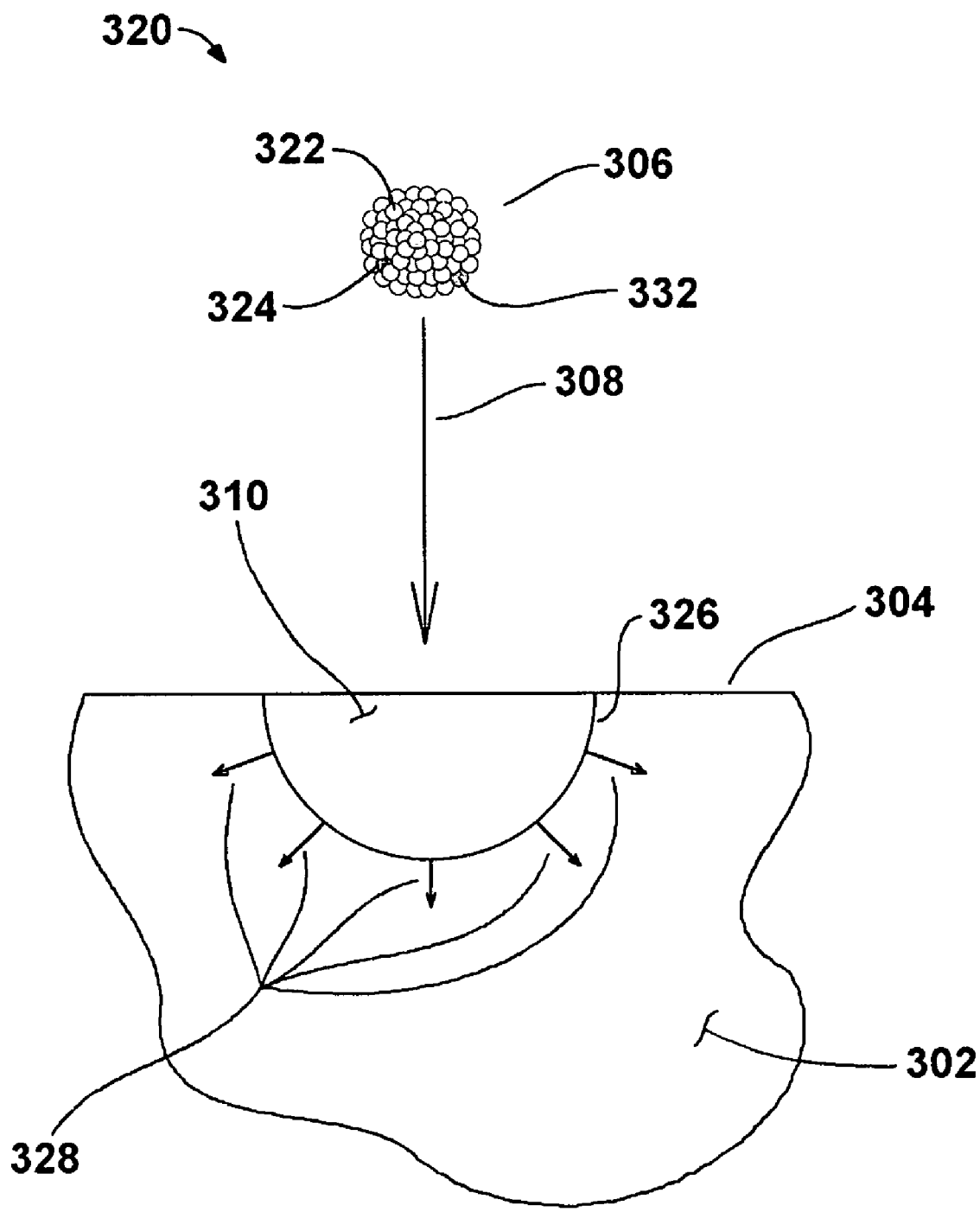
FIG. 4 is a schematic enlarging a portion of the semiconductor wafer from FIG. 3, showing additional detail including a mixed-gas-cluster ion.

FIG. 4 is a schematic 320 enlarging a portion of the semiconductor wafer 302 from FIG. 3, showing additional detail. Gas-cluster ion 306 comprises multiple molecules of at least two gases that include at least a noble gas and a gas comprising either a dopant atom or a species to promote increased amorphization or to improve dopant solubility (germanium or silicon, for example). The gas-cluster ion 306 contains noble gas atoms 322 and gas molecules 324 comprising either a dopant atom species or a species to promote increased amorphization or to improve dopant solubility such as, for example, germanium or silicon. Optionally, the gas-cluster ion 306 may contain additional dopant atom species or amorphization-promoting or dopant solubility improving molecules 332 of a type different than that of gas molecules 324. Thus, the cluster 306 may be comprised of at least a noble gas portion and multiple, fractional portions of distinct molecule species of dopant atoms or amorphization-promoting or dopant solubility improving atom species. Such a gas-cluster ion 306 may be formed in a GCIB processing apparatus 200 as shown in or similar to those shown in FIG. 2, for example. When it is desired to have a mixture of gasses in the gas-clusters, a premixed gas mixture with the desired mix can be provided in a single gas storage cylinder 111 (FIG. 2) or alternatively, separate, differing source gases or source gas mixtures 112 and 222 can be provided in gas storage cylinders 111 and 221 (FIG. 2) and then mixed in desired proportions as they flow to the stagnation chamber 116 (FIG. 2) by suitable adjustment of gas metering valves 113 and 223 (FIG. 2), which are preferably mass flow controller valves. Thus, it is possible to generate gas-cluster ion beams with a controllable mixture of two or more gasses. Referring again to FIG. 4, the gas-cluster ion 306 is shown (for example and not for limitation) to comprise noble gas atoms 322 and multiple types of dopant or amorphization promoting gas molecules 324, 332. It is recognized that a wide range of mixtures of noble gas, dopant and amorphization promoting gas molecules are useful in the present invention and that the clusters used for the process of the invention can be formed from noble gas mixed with very high concentrations of dopant or amorphization promoting gas molecules, or at the other extreme, the ratio of dopant or amorphization promoting gas molecules to noble gas molecules may be so low that some or many gas-cluster ions do not contain even a single non-noble gas molecule, but wherein at least a portion of the gas-cluster ions in a gas-cluster ion beam comprise one or more molecules of dopant or amorphization promoting gas molecules. Typically, the concentration of amorphization promoting gas molecules, if present, will comprise on the order a few to several tens of molecular percent of the gas-cluster ions, while any dopant-containing gas molecules will be of lower molecular concentration (for example, not for limitation, from about 0.01 to about 20 molecular percent) in the gas-cluster ions. The gas-cluster ion-impact region 310 has a boundary 326. The volume of the gas-cluster ion-impact region 310 and hence it's depth of penetration of the surface of the semiconductor is dependent on the preselected and controlled energy of the gas-cluster ion 306. It is preferable to use gas-cluster ions having energies in the range of from about 1 keV to about 40 keV per ionic charge (acceleration potentials of from about 1 kV to about 40 kV). Upon impact of an energetic gas-cluster ion 306 on the surface 304, the gas-cluster ion 306 dissociates and the individual dopant or amorphization promoting gas molecules from the dissociated cluster become free. Inert gas molecules typically recoil and escape from the surface 304 of the semiconductor wafer 302. Some molecules including some of the dopant or amorphization promoting gas molecules become infused into the surface. Other than a small energy carried away by the escaping individual gas atoms, the total energy of the energetic gas-cluster ion 306 becomes deposited into the gas-cluster ion-impact region 310. The dimensions of the gas-cluster ion-impact region 310 are dependent on the energy of the cluster but are small—on the order of tens or hundreds of angstroms in diameter—depending on the preselected gas-cluster ion energy. Because of the deposition of most of the total energy carried by the gas-cluster ion 306 into the small gas-cluster ion-impact region 310, an intense thermal transient occurs within the material in the gas-cluster ion-impact region 310. The heat deposited in the gas-cluster ion-impact region 310 dissipates by conduction in the directions 328 deeper into the surrounding semiconductor material. Duration of the thermal transient is determined by the thermal conductivity of the surrounding material but will typically be less than $10^{-6}$ second.

In the gas-cluster ion-impact region 310, material can momentarily reach temperatures of many hundreds to several thousands of degrees Kelvin. As an example, impact of a gas-cluster ion 306 when carrying 10 keV total energy is estimated to be capable of producing a momentary temperature increase of about 2000 degrees Kelvin throughout an gas-cluster ion-impact region 310 extending to almost 100 Angstroms below the surface 304. Without being bound to a particular theory, it is believed that during the thermal transient, thermal agitation is high enough to possibly melt the material in the gas-cluster ion-impact region 310. As the gas-cluster ion-impact region 310 cools by thermal conduction in the directions 328, part of the dopant or amorphization promoting material in the impacted cluster becomes infused into the cluster ion impact region 310 and is incorporated into the cooled surface. Another potential effect of the thermal transient is the restoration or partial restoration of crystallinity for damaged material within much of the gas-cluster ion-impact region.

Figure 5:
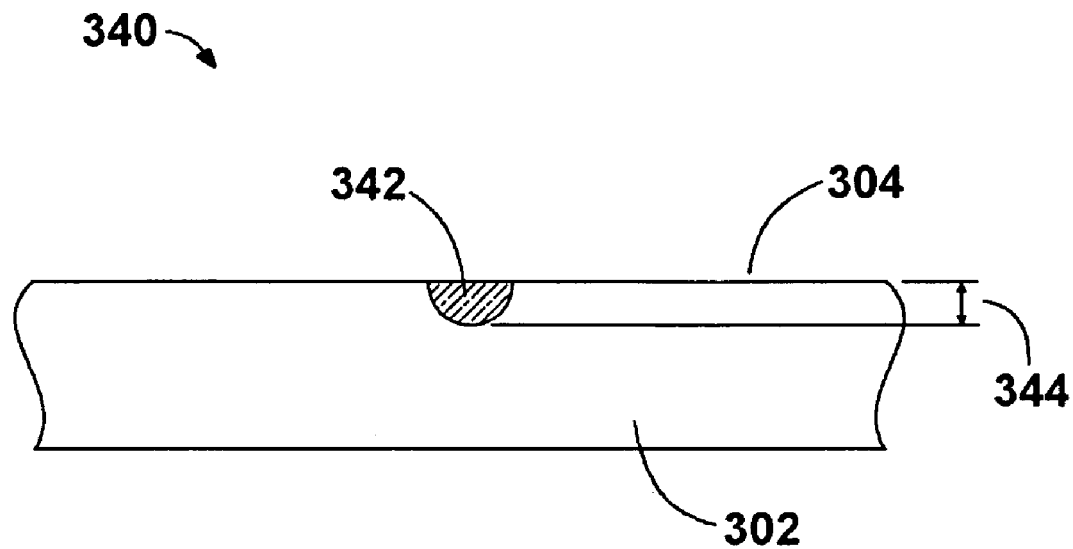
FIG. 5 is a schematic of a portion of a semiconductor wafer, showing modification of the surface in the affected zone of a cluster impact, according to the invention.

FIG. 5 is an illustration of a surface region 340 of a portion of a semiconductor wafer 302, showing infusion of dopant or amorphization promoting atoms into a region impacted by a gas-cluster ion, according to the present invention. After the gas-cluster ion-impact event described in FIG. 4, upon dissipation of the thermal transient, an infused region 342 replaces the gas-cluster ion-impact region 310 of FIG. 4. Infused region 342 extends to a depth 344 below the surface 304 of semiconductor wafer 302.

Figure 6:
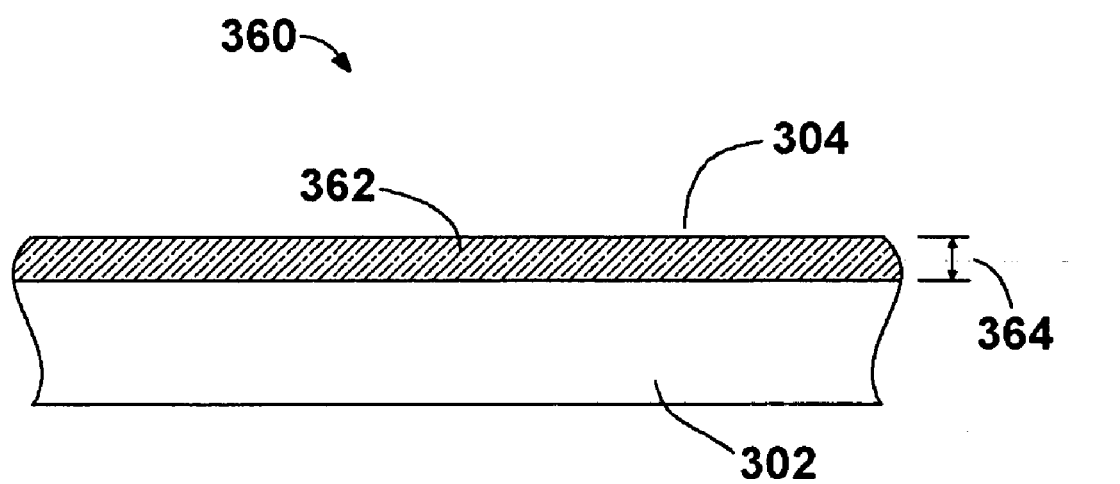
FIG. 6 is a schematic of a portion of a semiconductor wafer, showing modification of surface regions impacted by many gas-cluster ions forming a surface film according to the invention.

FIG. 6 is an illustration of a surface region 360 of a portion of a semiconductor wafer 302, showing an infused film 362 formed by completion of gas-cluster ion beam processing according to the present invention. With continued gas-cluster ion irradiation, infused regions similar to the infused region 342 (FIG. 5) form, overlap, and eventually develop the infused film 362, extending to a depth 364 below the surface 304 of the semiconductor wafer 302.

Figure 7:
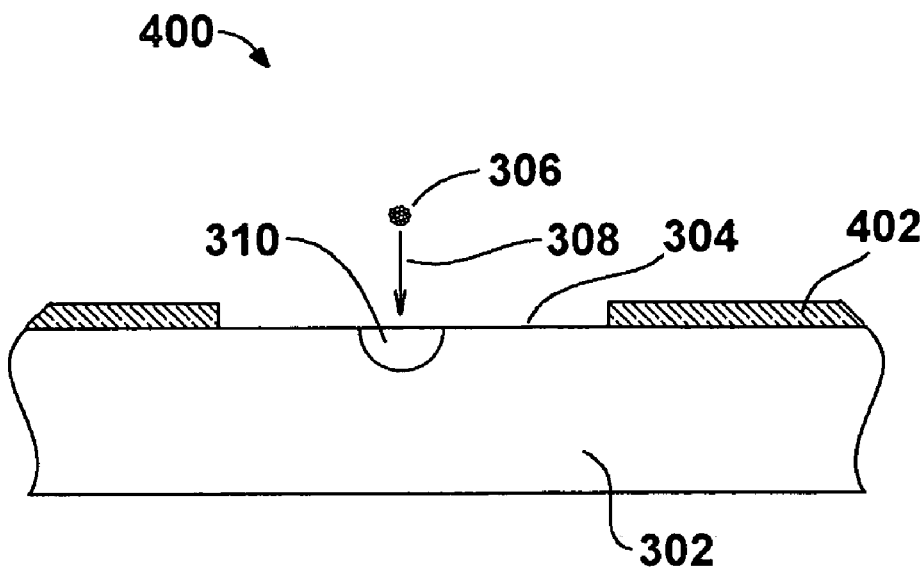
FIG. 7 is a schematic of a portion of a semiconductor wafer, showing mask controlled localization of processing during irradiation by gas-cluster ions.

FIG. 7 is an illustration of a surface region 400 of a portion of a semiconductor wafer 302 being impacted by a gas-cluster ion 306 comprising a mixture of noble gas and other gas molecules. The figure is not drawn to scale. The semiconductor wafer 302 has a surface 304 and is typically a single crystal material and may be at any of several stages of processing for fabricating an integrated circuit or semiconductor device. A portion of the surface 304 of the semiconductor wafer 302 is covered by a mask 402 that masks part of the surface 304 from irradiation by energetic clusters. A gas-cluster ion 306 having a trajectory 308 is shown impacting surface 304 of semiconductor wafer 302 in an unmasked region, where it forms a gas-cluster ion-impact region 310. Any clusters that strike the mask 402 are prevented by the mask from affecting the surface 304 of the semiconductor wafer 302. The mask 402 can be either a hard mask like silicon dioxide, or a soft mask such as photoresist material.

Figure 8:
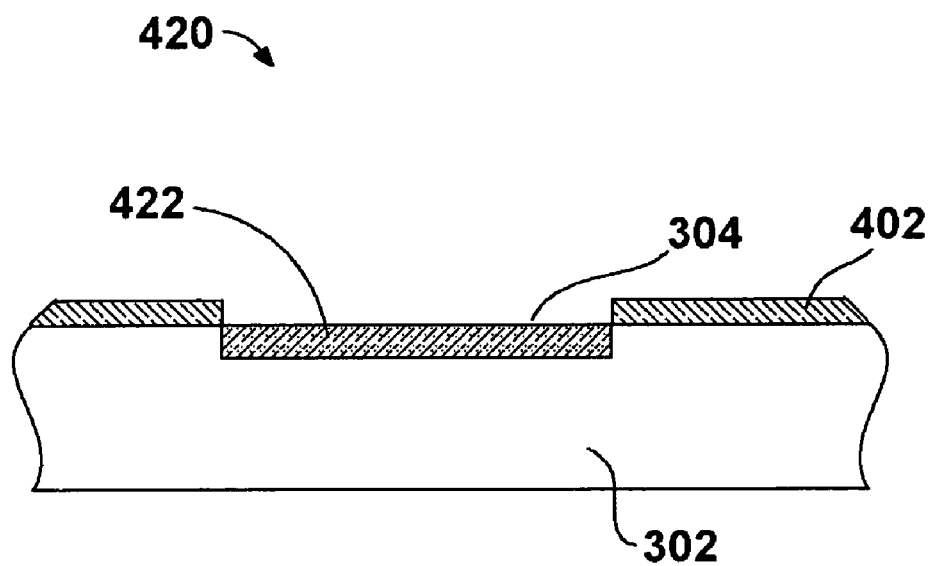
FIG. 8 is a schematic of a portion of a semiconductor wafer after mask controlled localization of processing during gas-cluster ion irradiation to form an infused film by gas-cluster ion beam processing.

FIG. 8 is an illustration of a surface region 420 of a portion of a semiconductor wafer 302, showing an infused film 422 formed by completion of gas-cluster ion beam processing of the masked wafer shown in FIG. 7, according to the present invention. With continued gas-cluster ion irradiation, infused regions similar to the infused region (342 FIG. 5) form, overlap, and eventually develop the infused film 422 only at the exposed surface regions of the mask 402.

FIGS. 6 and 8 show the formation of infused films (362 and 422) on semiconductor substrates. Doped films and/or amorphized films can be can be formed. The amount of processing that occurs is a function of both cluster ion energy and cluster ion dose. The process herein referred to as "infusion" occurs (the dopant and/or amorphization promoting atoms in the gas-cluster ions become mixed into the shallow subsurface regions of the irradiated surface (362 and 422 in FIGS. 6 and 8 respectively). Specific examples of some of the useful processes will be given in additional detail hereinafter. Some re-crystallization and electrical activation can also be achieved in originally damaged material in the impact region at the surface by the gas-cluster ion beam processing.

Experimental Results

Figure 9:
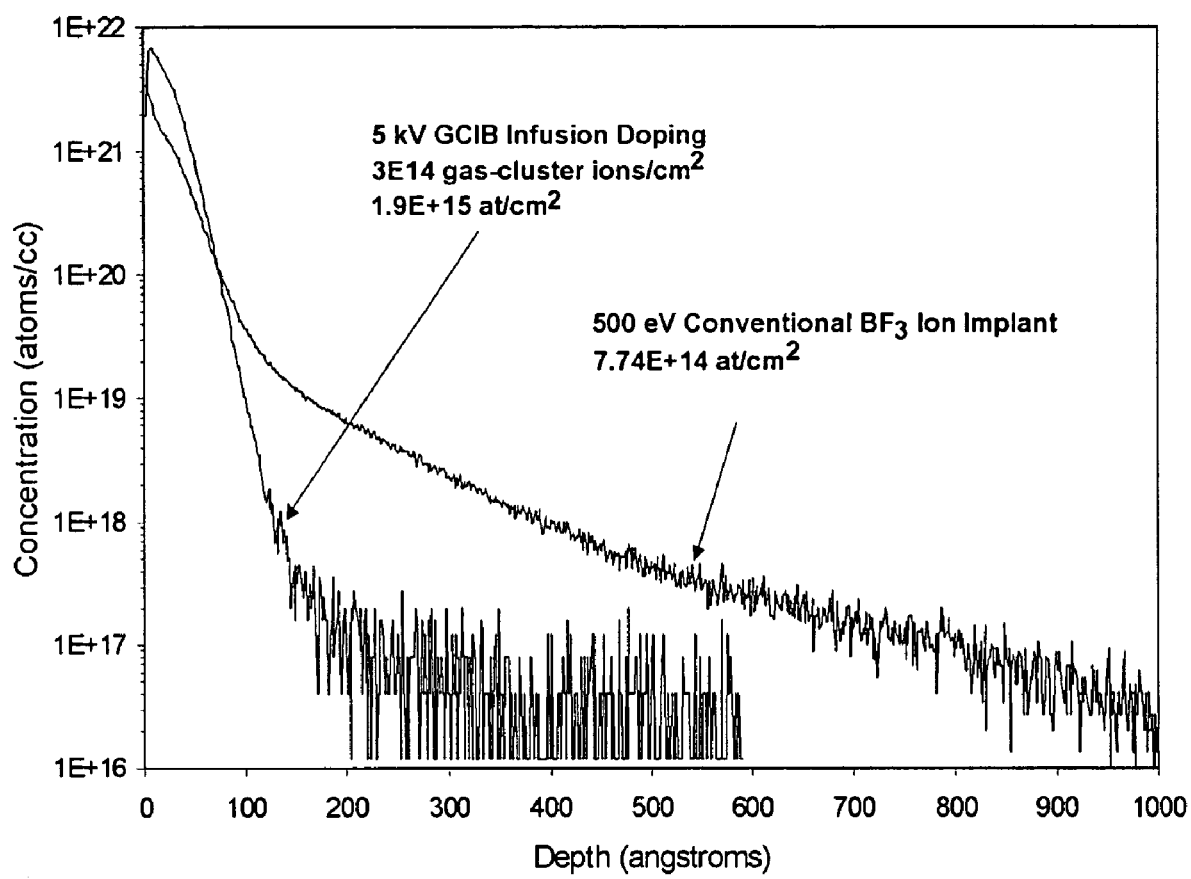
FIG. 9 is a graph showing results of Secondary Ion Mass Spectrometry (SIMS) depth profile measurements comparing conventional ion implantation and GCIB infusion, both in a silicon substrate.

FIG. 9 is a graph showing results of Secondary Ion Mass Spectrometry (SIMS) depth profile measurements comparing conventional ion implantation and GCIB infusion, both in a silicon substrate. A conventional 500 eV $BF_3$ implant and a GCIB boron infusion (according to the invention) performed using a mixture of 1% $B_2H_6$ in argon are compared. Both doping processes were accomplished without a pre-amorphization step. While the as-implanted 500 eV boron profile shows a prominent channeling tail that results in a $1 \times 10^{18}$ at/cc concentration at approximately 400 angstroms, the GCIB as-infused profile shows a $1 \times 10^{18}$ at/cc concentration at approximately 120 angstroms and exhibits a very abrupt concentration gradient of approximately 25 angstroms/decade. The GCIB infusion was performed using 5 kV acceleration potential resulting in 5 keV energy for singly charged clusters and higher energies for multiply charged clusters. The cluster infusion dose of $3 \times 10^{14}$ clusters/cm$^2$ resulted in a boron dose of approximately $1.9 \times 10^{15}$ at/cm$^2$. A gas-cluster ion beam processing system similar to that shown in FIG. 2 was used to perform the GCIB infusion process.

Figure 10:
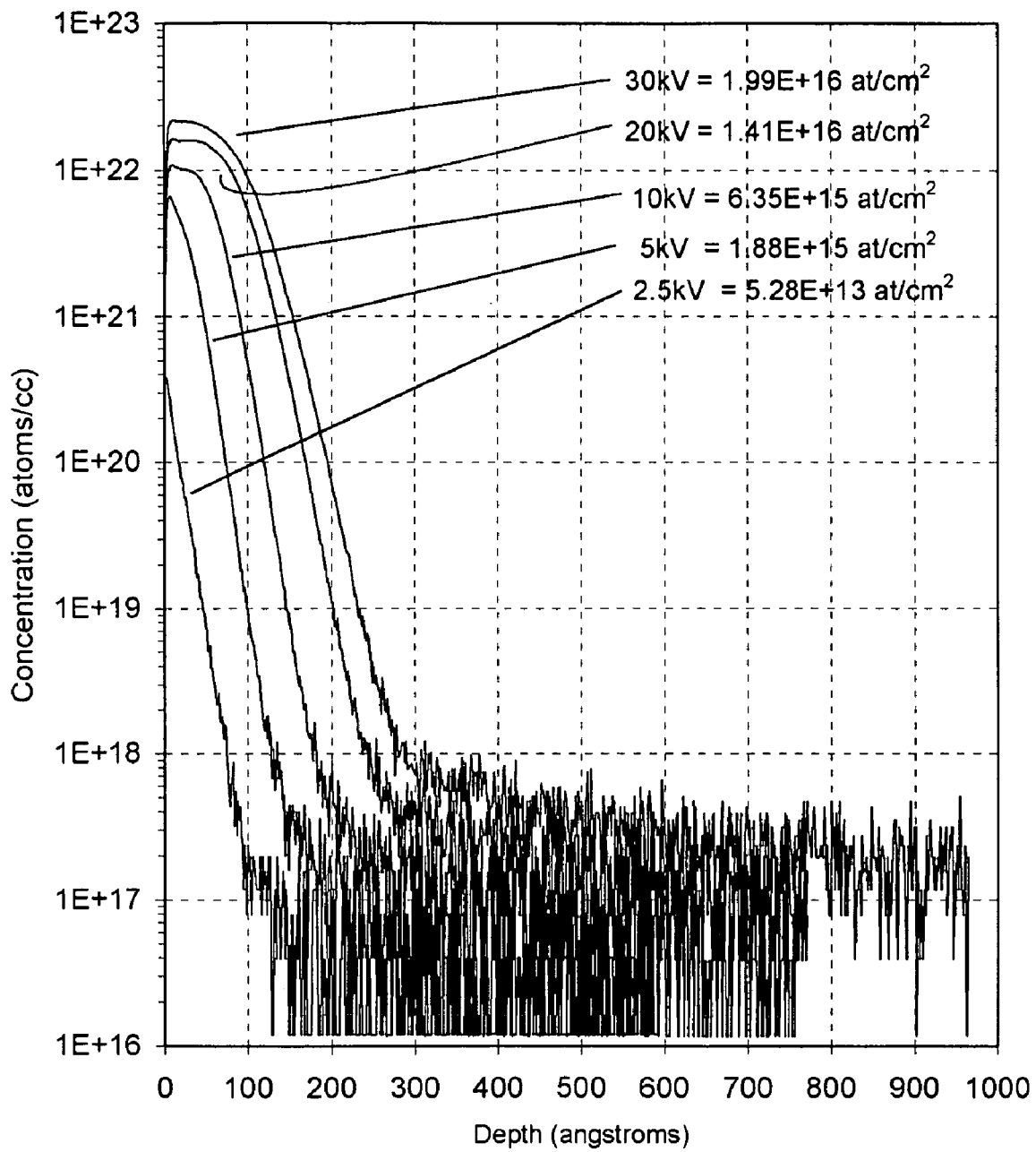
FIG. 10 is a graph showing results of SIMS measurement of a series of boron infused films formed by application of the invention.

FIG. 10 is a graph showing results of SIMS measurement of a series of boron infused films formed by a method in accordance with the invention. GCIB boron infusion (according to the invention) was performed using a mixture of 1% $B_2H_6$ in argon at five different gas-cluster acceleration potentials (2.5, 5, 10, 20, and 30 kV). All were accomplished without a pre-amorphization step. All were performed with $3 \times 10^{14}$ gas clusters/cm$^2$ infusion doses which resulted in corresponding boron atom doses shown on the face of the FIG. 10 graph. The boron $1 \times 10^{18}$ at/cc concentration depths were approximately (75, 120, 180, 240, and 280 angstroms, respectively). The GCIB infusions performed using acceleration potentials (2.5, 5, 10, 20, and 30 kV) resulted in cluster energies for singly charged clusters of (2.5, 5, 10, 20, and 30 keV respectively) and higher energies for multiply charged clusters. A gas-cluster ion beam processing system similar to that shown in FIG. 2 was used to perform the GCIB infusion process.

Figure 11:
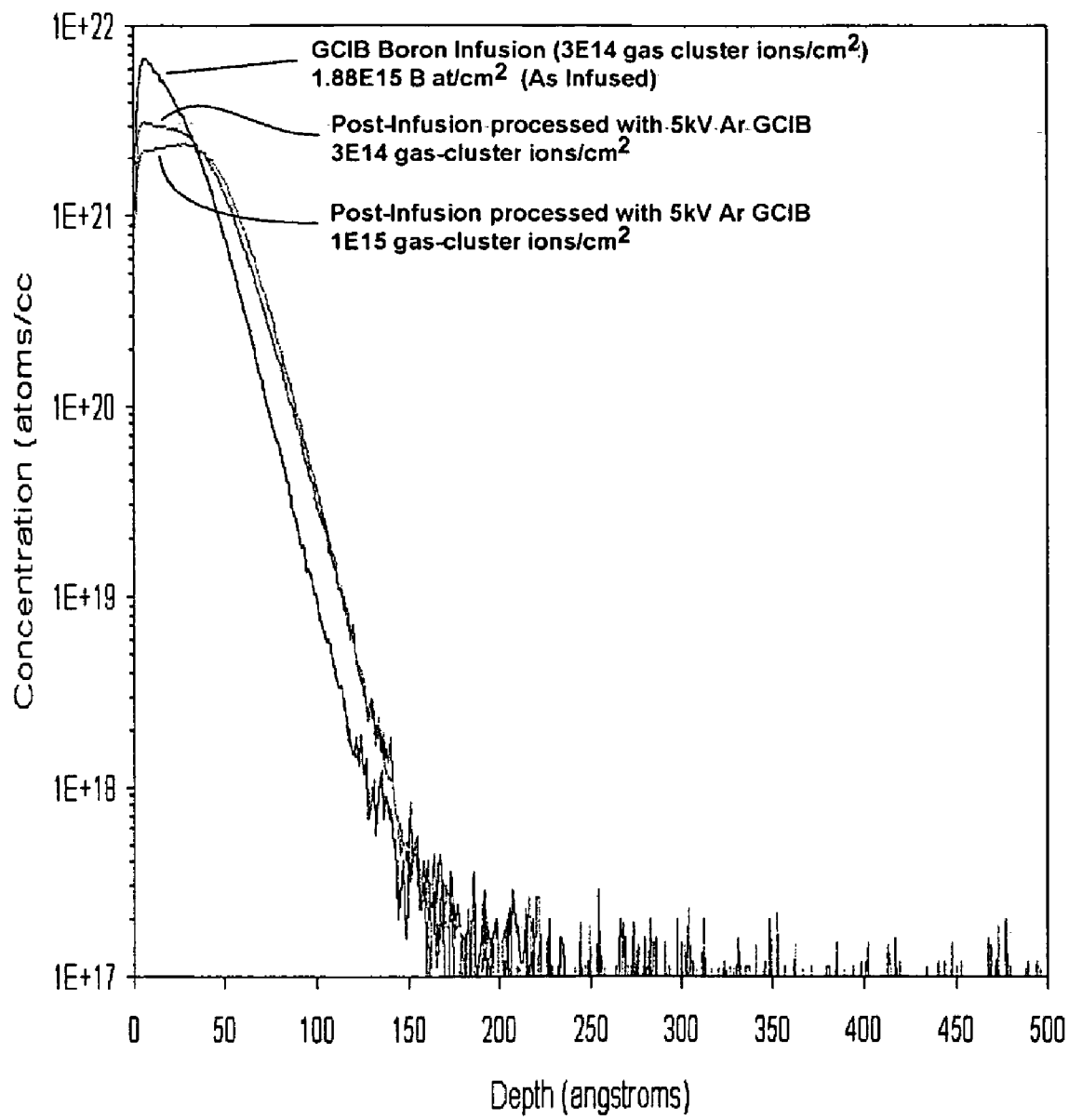
FIG. 11 is a graph showing results of SIMS measurement of an infusion doped film formed by a specific application of the invention and showing effects of subsequent processing by argon GCIB.

FIG. 11 is a graph showing results of SIMS measurement of an infusion doped film formed by a specific application of the invention and showing effects of subsequent processing by argon GCIB. In this example, a gas-cluster ion beam processing system similar to that shown in FIG. 2 was used to perform a boron infusion doping of a silicon semiconductor wafer substrate. A mixture of 1% diborane ($B_2H_6$) in argon was used as a source gas for gas-cluster formation and a GCIB infusion dose of $3 \times 10^{14}$ gas-cluster ions/cm$^2$ was irradiated to the substrate. One region of the substrate was subsequently additionally irradiated with an argon GCIB gas-cluster ion dose of $3 \times 10^{14}$ gas-cluster ions/cm$^2$ accelerated by a 5 kV acceleration potential. A second region of the substrate was subsequently additionally irradiated with an argon GCIB gas-cluster ion dose of $1 \times 10^{15}$ gas-cluster ions/cm$^2$, accelerated by a 5 kV acceleration potential. The FIG. 11 graph shows the original as-infused boron distribution and also shows that the two post-infusion operations of additional argon GCIB irradiation were effective in flattening the peak of the as-infused distribution and that for a given argon GCIB acceleration potential (5 kV) the depth of the tail of the distribution is substantially independent of the argon GCIB gas-cluster ion dose, both cases resulting in improving the initial as-infused distribution by flattening the peak while retaining a very abrupt concentration gradient in the tail. The $1 \times 10^{18}$ at/cc concentration of the argon processed samples both being approximately 150 angstroms deep. The tail of the redistributed boron distribution appears to depend primarily on the argon GCIB acceleration potential and not on the GCIB gas-cluster ion dose. In many semiconductor applications, the flattened profile peak obtained by the argon GCIB post-infusion doping processing is preferred over the original as-infused boron distribution profile.

Figure 12:
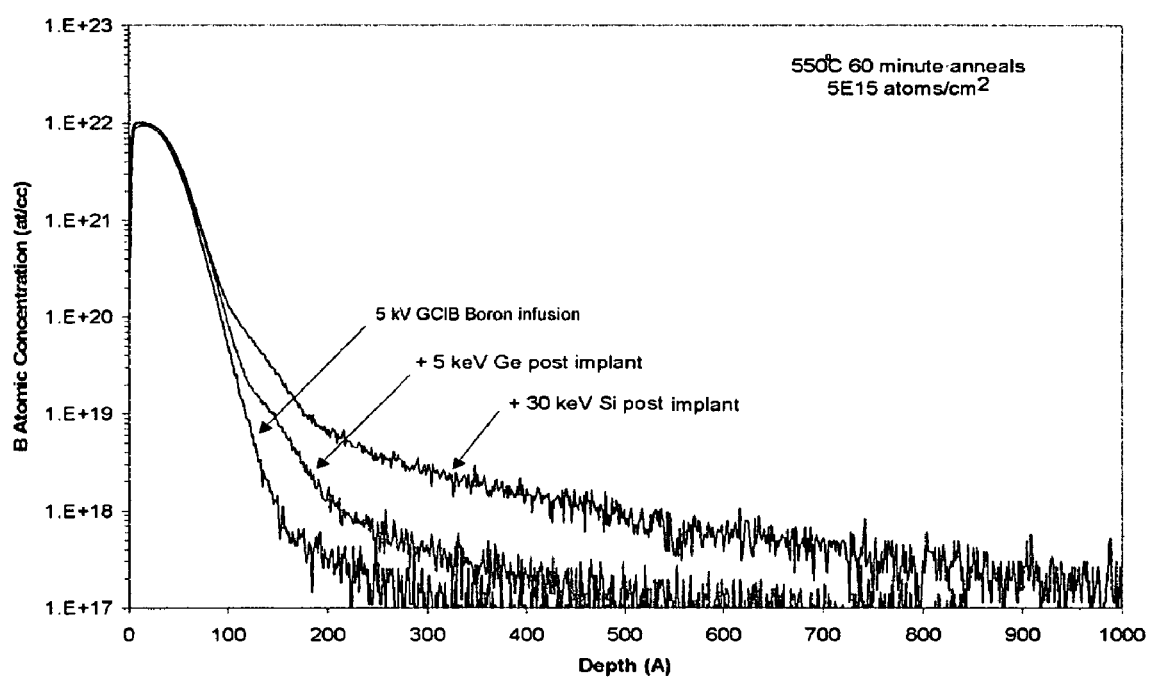
FIG. 12 is a graph showing results of SIMS measurements boron GCIB infusion doping following furnace anneal for three specific example applications of the invention.

FIG. 12 is a graph showing results of SIMS measurements boron GCIB infusion doping following furnace anneal for three specific example applications of the invention. In all three examples, a gas-cluster ion beam processing system similar to that shown in FIG. 2 was used to perform a boron infusion doping of a silicon semiconductor wafer substrate. A mixture of 1% diborane ($B_2H_6$) in argon was used as a source gas for gas-cluster ion formation, a 5 kV acceleration potential was used to accelerate the GCIB and a GCIB infusion dose selected to result in a $5 \times 10^{15}$ boron atom/cm$^2$ doping of the silicon was irradiated to each of three substrates. One of the boron infused substrates was subsequently additionally post-infusion amorphized with a 30 keV conventional ion implantation of silicon ions to an implant dose of $1 \times 10^{15}$ Si ions/cm$^2$. A second of the boron infused substrates was subsequently additionally post-infusion irradiated with a 5 keV conventional ion implantation of germanium ions to an implant dose of $5 \times 10^{14}$ Ge ions/cm$^2$. All three infused substrates were subsequently annealed in a furnace at 550 degrees C. for 60 minutes. In the case of boron infusion without subsequent post-infusion amorphization, the annealed boron profile was essentially the same as the as-infused profile (not shown). In the case of the germanium ion implant post-infusion amorphization, there was seen a modest amount of boron redistribution, with the $1 \times 10^{18}$ boron atom/cc concentration depth increasing from approximately 140 angstroms to approximately 220 angstroms. In the case of the silicon ion implant post-infusion amorphization, there was seen a larger amount of boron redistribution, with the $1 \times 10^{18}$ boron atom/cc concentration depth increasing from approximately 140 angstroms to approximately 450 angstroms. These examples show that although conventional ion implantation can be used to facilitate dopant activation with annealing, it results some redistribution of the dopant after low temperature anneal.

Figure 13:
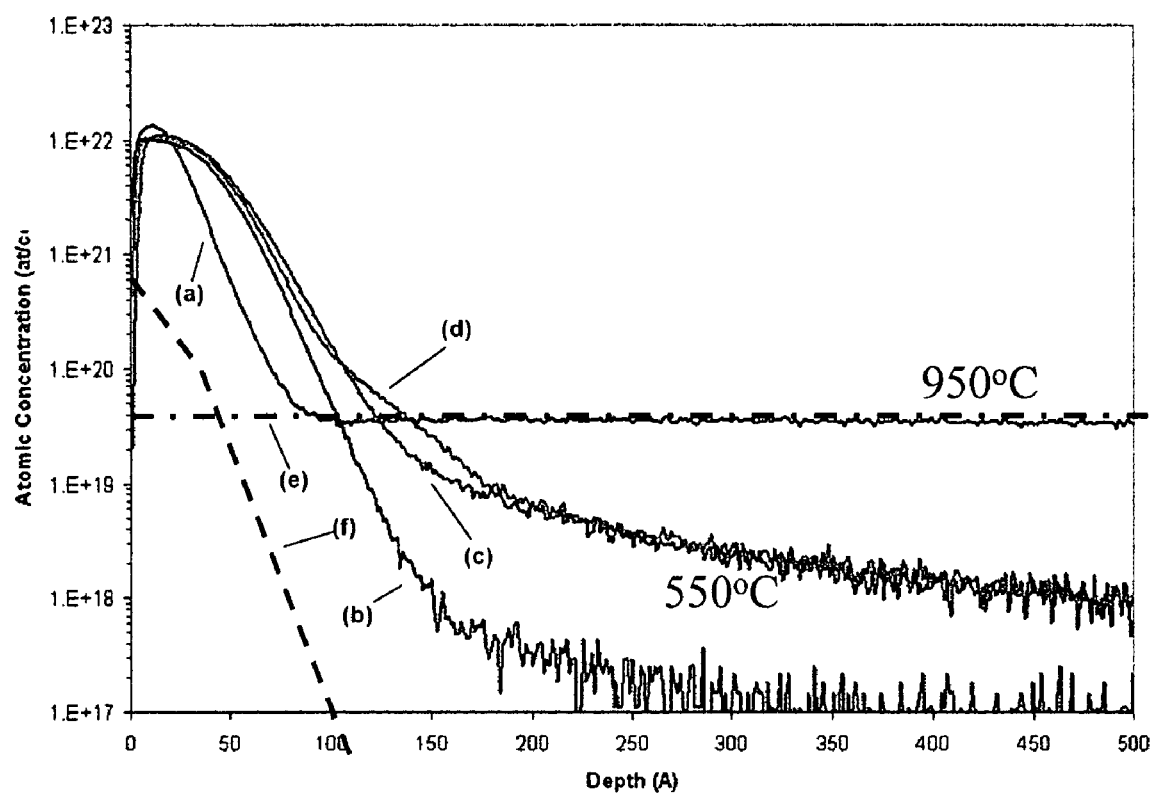
FIG. 13 is a graph showing results of SIMS and spreading resistance probe (SRP) measurement on boron infused silicon processed according to specific applications of the invention.

FIG. 13 is a graph showing results of SIMS and spreading resistance probe (SRP) measurement on boron infused silicon processed according to specific applications of the invention. In all the examples shown in FIG. 13, a gas-cluster ion beam processing system similar to that shown in FIG. 2 was used to perform a boron infusion doping of a silicon semiconductor wafer substrate. A mixture of 1% diborane ($B_2H_6$) in argon was used as a source gas for gas-cluster ion formation, a 5 kV acceleration potential was used to accelerate the GCIB and a GCIB infusion dose selected to result in a $5 \times 10^{15}$ boron atom/$cm^2$ doping of each silicon substrate (same boron infusion conditions as for the cases shown in FIG. 12). In case (b) the boron infused substrate was furnace annealed at 550 degrees C. for 60 minutes. The boron distribution in this case (b) was substantially unchanged from the as-infused case (not shown). In case (a) the boron infused substrate was furnace annealed at 950 degrees C. for 60 minutes. In case (a) the high temperature anneal resulted in considerable diffusion of the dopant. SRP measurements for case (a) are indicated by the dash-dot curve (e) and show an activated dopant level of $3 \times 10^{19}$ boron atoms/cc, but with a deep junction of 3000-4000 angstroms. In case (d) the infused boron was subsequently post-infusion amorphized with 30 keV, $1 \times 10^{15}$ Si ions/$cm^2$ conventional ion implantation amorphization. After amorphization with silicon, the case (d) was furnace annealed for 60 minutes at 550 degrees C. SRP measurements for case (d) are indicated by the dashed curve (f) and show an electrical junction depth of approximately 50 angstroms.

Figure 14:
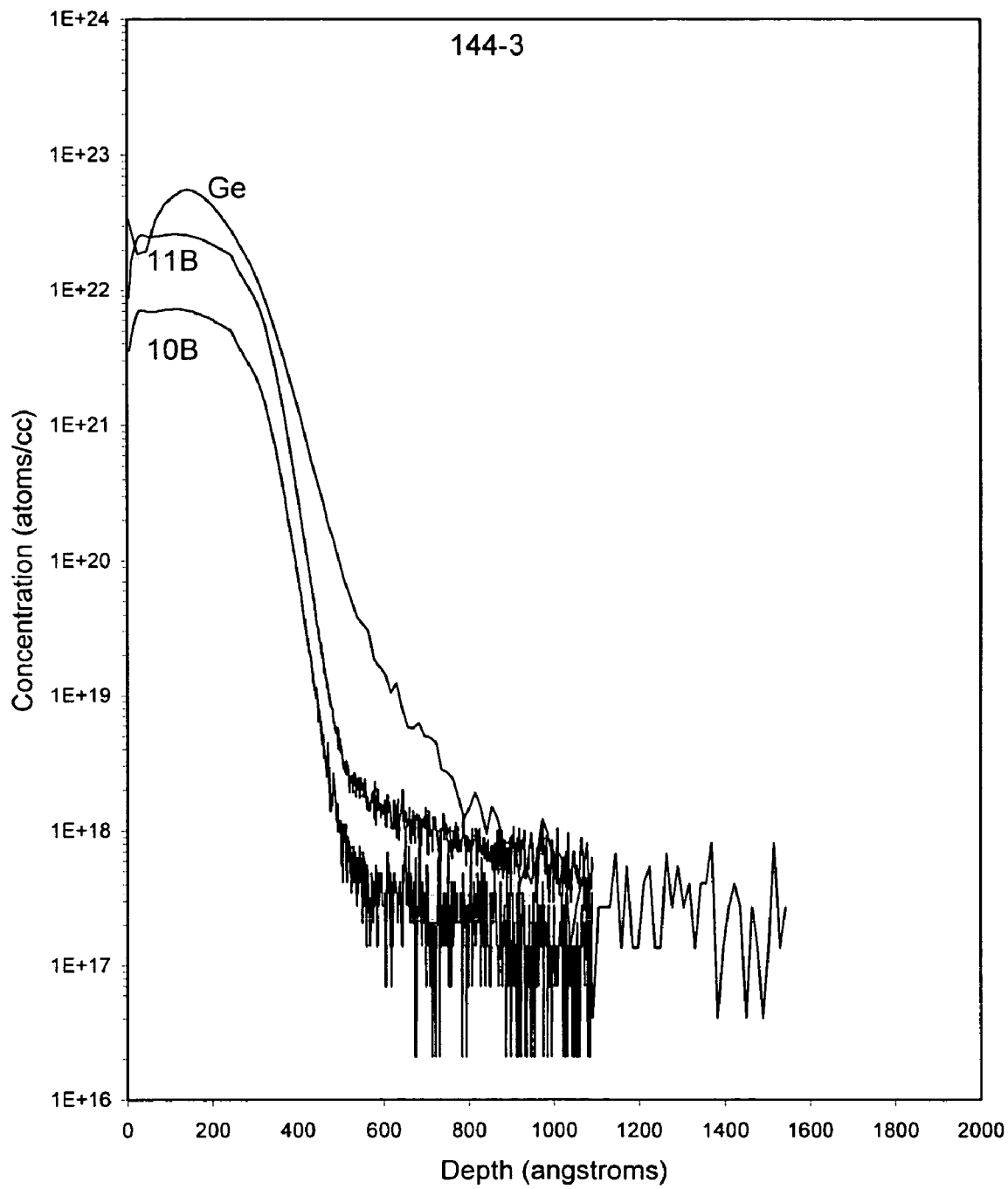
FIG. 14 is a graph showing results of SIMS measurement of an infused film formed by a specific application of the invention.

FIG. 14 is a graph showing results of SIMS measurement of an infused film formed by a specific application of the invention. In this example (identified as sample 144-3), a gas-cluster ion beam processing system similar to that shown in FIG. 2 was used to process the surface of a silicon semiconductor wafer. A mixture of 5% germane ($GeH_4$) in argon was used as one source gas for gas-cluster formation, while a mixture of 1% diborane ($B_2H_6$) in argon was used as a second source gas for gas-cluster formation. The two source gases were mixed as they flowed into the stagnation chamber—the germane mixture was fed at a rate of 30 sccm and the diborane mixture was fed at a rate of 300 sccm. The ionized gas-cluster ion beam was accelerated by 30 kV acceleration voltage and a dose of $1 \times 10^{15}$ gas-cluster ions/$cm^2$ was irradiated onto the silicon wafer. The SIMS analysis confirms that a surface infused with boron ions and simultaneously infused with germanium ions for amorphizing the layer (or for increasing the solid solubility limit of a dopant) has been formed.

Figures 15A, 15B, 15C:
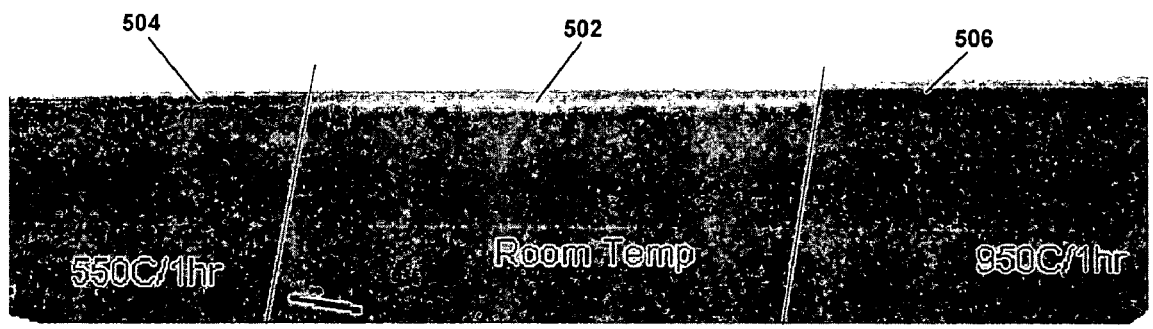
FIG. 15 (A, B, C) is cross-sectional transmission electron micrographs showing amorphous layer formation in silicon by germanium GCIB Ge infusion.

FIGS. 15A-15C are cross-sectional transmission electron micrographs showing amorphous layer formation in silicon by germanium GCIB Ge infusion. The sample shown in FIG. 15A is as-infused (approximately $1 \times 10^{15}$ germanium atoms/$cm^2$ infused by GCIB infusion using 5% $GeH_4$ in argon as gas-cluster ion source gas) and clearly shows the amorphous layer 502 formation. FIG. 15B shows the germanium infused layer of FIG. 15A after a 60 minute, 550 degree C. furnace anneal and shows the conversion of the amorphous layer 502 to a single-crystalline layer 504. FIG. 15C shows the germanium infused layer of FIG. 15A after a 60 minute, 950 degree C. furnace anneal and also shows conversion of the amorphous layer to a single crystalline layer.

Figure 16:
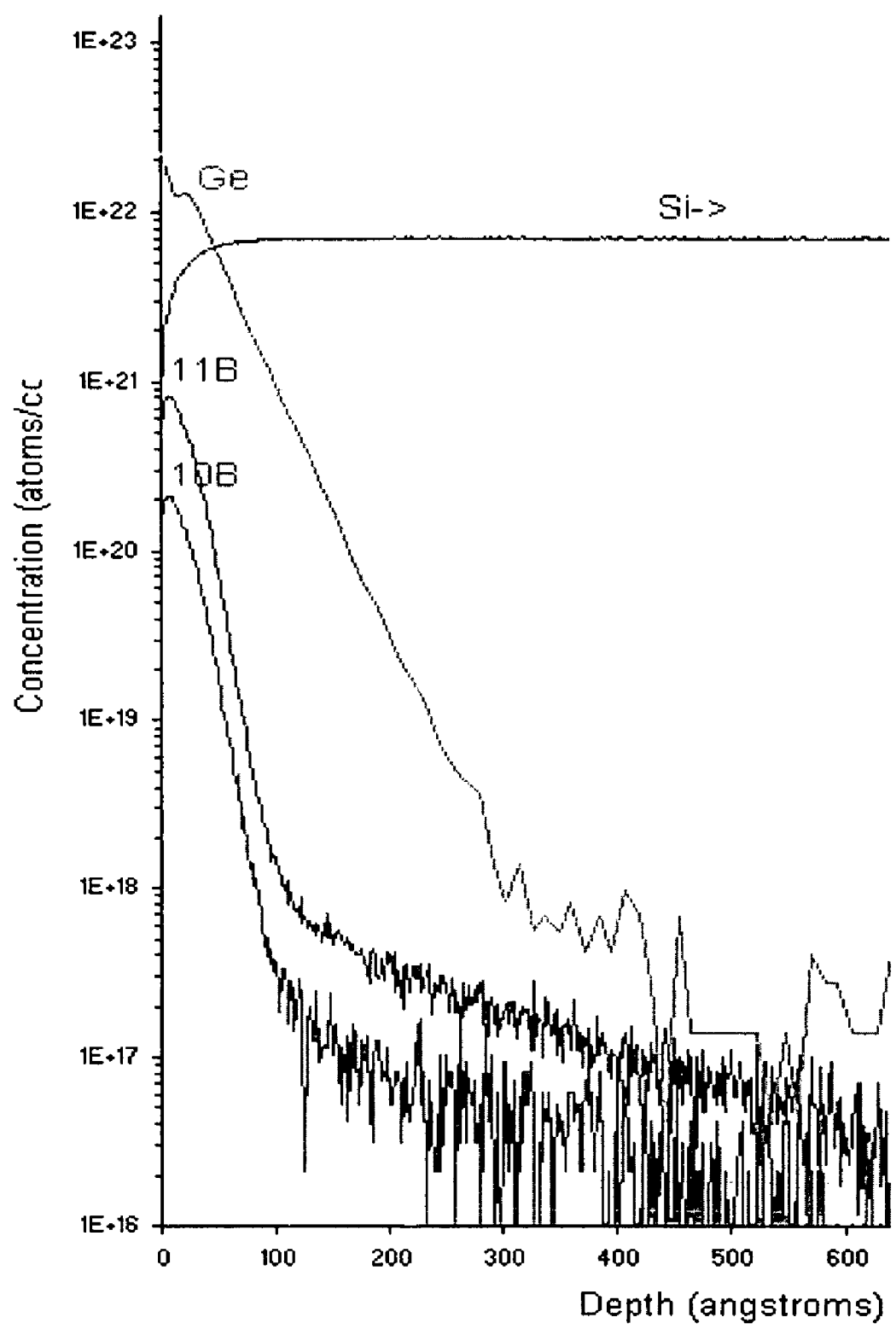
FIG. 16 is graph showing results of SIMS measurements of an infused film formed by a specific application of the invention.

FIG. 16 is graph showing results of SIMS measurements of an infused film formed by a specific application of the invention. In this example, a gas-cluster ion beam processing system similar to that shown in FIG. 2 was used to process the surface of a silicon semiconductor wafer. A mixture of 5% germane ($GeH_4$) in argon was used as one source gas for gas-cluster formation, while a mixture of 1% diborane ($B_2H_6$) in argon was used as a second source gas for gas-cluster formation. The two source gases were mixed as they flowed into the stagnation chamber—the germane mixture was fed at a rate of 300 sccm and the diborane mixture was fed at a rate of 75 sccm. The ionized gas-cluster ion beam was accelerated by 5 kV acceleration voltage and a dose of $1 \times 10^{15}$ gas-cluster ions/$cm^2$ was irradiated onto the silicon wafer. The SIMS analysis confirms that a surface infused with boron ions and simultaneously infused with germanium ions for amorphizing the layer (as shown in FIG. 15A) or for increasing the solid solubility limit of the boron dopant has been formed.

Figure 17:
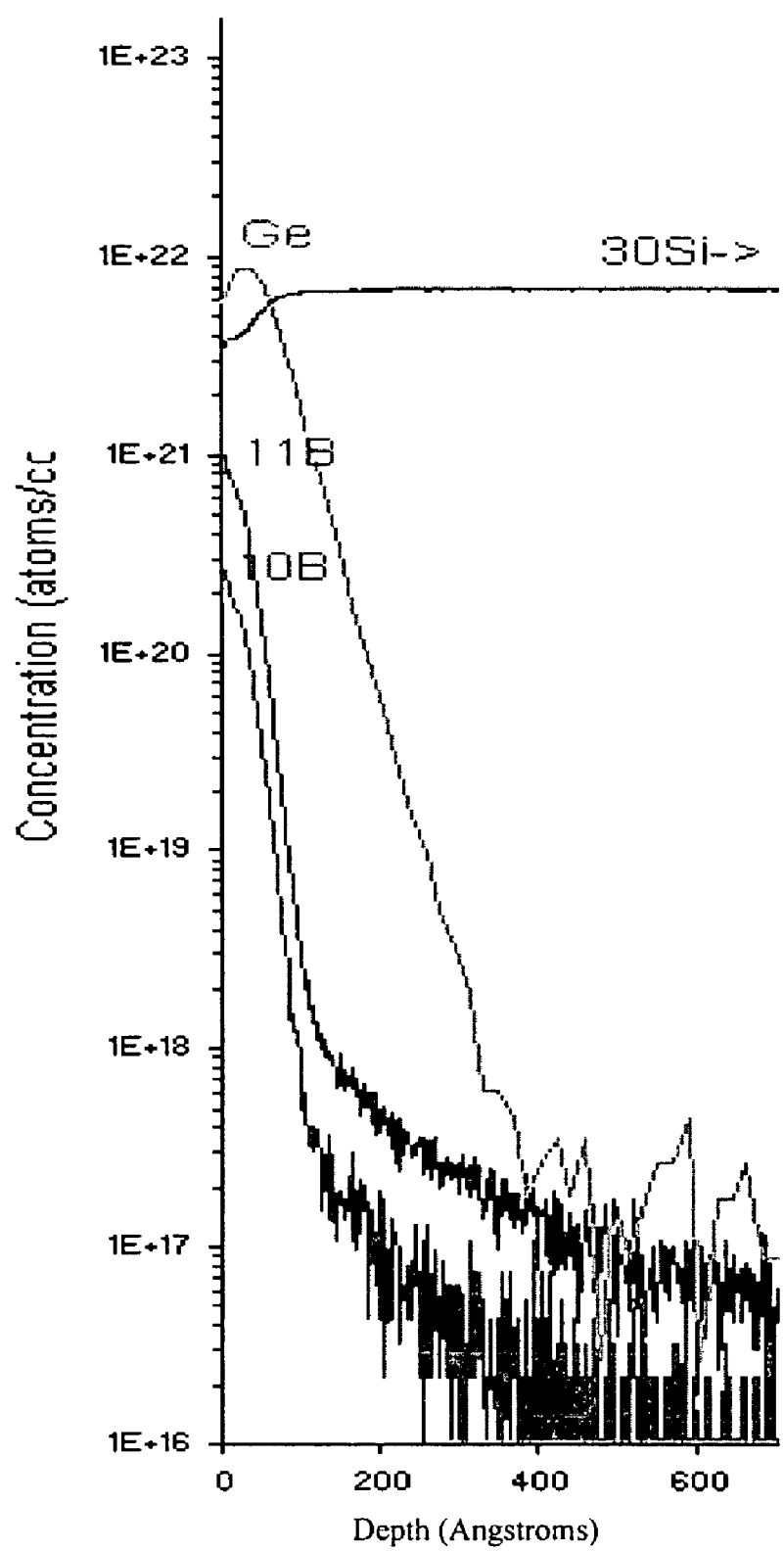
FIG. 17 is graph showing results of SIMS measurements of the infused film of FIG. 16 after annealing for activation.

FIG. 17 is graph showing results of SIMS measurements of the infused film of FIG. 16 after annealing for activation. In this example the boron-germanium infused film was furnace annealed for 60 minutes at 550 degrees C. When compared to the SIMS plots of FIG. 16, it is seen that no significant movement of the dopant occurred as a result of the anneal. Evaluation of the film after anneal showed that the doped junction was electrically activated and remained very shallow and abrupt Although the invention has been described with respect to various embodiments, it should be realized this invention is also capable of a wide variety of further and other embodiments within the spirit of the invention.

It is claimed:

1. A method for forming one or more doped regions in a semiconductor substrate, comprising the steps of:
    maintaining a reduced-pressure environment around a substrate holder for holding a semiconductor substrate having a surface;
    holding the semiconductor substrate securely within said reduced-pressure environment;
    providing to said reduced-pressure environment a gas-cluster ion beam formed from a pressurized gas mixture including an inert gas and at least one dopant atom species;
    accelerating the gas-cluster ion beam; and
    irradiating the accelerated gas cluster ion beam onto one or more portions of the surface of the semiconductor substrate to form one or more doped semiconductor regions within the substrate.

2. The method of claim 1, wherein the providing step further comprises the steps of:
    delivering the pressurized gas mixture to an expansion nozzle;
    flowing the pressurized gas mixture through the expansion nozzle into the reduced-pressure environment to fonn a jet containing gas-clusters; and
    ionizing at least a portion of the gas-clusters to form the gas-cluster ion beam.

3. The method of claim 1, wherein the gas-cluster ion beam contains gas-cluster ions having a mean size $\overline{N}$, where $\overline{N}$ is greater than 200.

4. The method of claim 1, wherein the inert gas comprises a noble gas.

5. The method of claim 1, wherein the gas mixture further includes at least one atom species for promoting increased amorphization in the irradiated portion of the semiconductor substrate.

6. The method of claim 1, wherein the at least one dopant atom species includes at least one atom species selected from the group consisting of P, B and As.

7. The method of claim 1, wherein the pressurized gas mixture includes at least one gas selected from the group consisting of $B_2H_6$, $BF_3$, $PH_3$, $PF_5$, $AsH_3$, and $AsF_5$.

8. The method of claim 7, wherein the at least one gas is present in the gas mixture in an amount of from about 0.01 molecular percent to about 20 molecular percent.

9. The method of claim 1, wherein the pressurized gas mixture further includes at least one gas that includes at least one atom species for promoting increased amorphization in the one or more irradiated portions of the semiconductor substrate.

10. The method of claim 9, wherein the at least one gas that includes at least one atom species for promoting increased amorphization is selected from the group consisting of $GeH_4$, $GeF_4$, $SiH_4$, and $SiF_4$.

11. The method of claim 1, wherein the irradiating step further comprises the step of scanning the gas-cluster ion beam across at least a portion of the surface of the semiconductor substrate.

12. The method of claim 1, wherein the irradiating step further comprises the step of scanning at least a portion of the surface of the semiconductor substrate through the gas-cluster ion beam.

13. The method of claim 1, wherein gas mixture comprises at least one noble gas and at least one second gas selected from the group consisting of $GeH_4$, $GeF_4$, $SiH_4$, and $SiF_4$, and at least one third gas selected from the group consisting of $B_2H_6$, $BF_3$, $PH_3$, $PF_5$, $AsH_3$, and $AsF_5$.

14. The method of claim 1, further comprising the step of treating the irradiated semiconductor substrate at an elevated temperature to at least partially restore crystallinity in the irradiated portions of the semiconductor substrate.

15. The method of claim 1, further comprising the step of treating the irradiated semiconductor substrate at an elevated temperature to at least partially activate dopant atom species in the irradiated portions of the semiconductor substrate.

16. The method of claim 1, wherein the semiconductor substrate is essentially silicon.

17. The method of claim 14, wherein the elevated temperature is less than about 600 degrees C.

18. The method of claim 15, wherein the elevated temperature is less than about 600 degrees C.

19. The method of claim 1, wherein:
the semiconductor substrate is essentially silicon;
the pressurized gas mixture further includes at least one germanium-containing gas; and
the doped semiconductor region formed has a dopant concentration that exceeds the solid solubility of the dopant in silicon.

20. The method of claim 19, further comprising the step of treating the irradiated semiconductor substrate at an elevated temperature to at least partially activate dopant atom species in the irradiated portions of the semiconductor substrate, and wherein the concentration of activated dopant in the doped region exceeds the solid solubility of the dopant in silicon.

21. The method of claim 1, further comprising the step of implanting at least one arnorphizing ion species into the doped semiconductor region within the substrate by a conventional ion implantation method.

22. The method of claim 21, wherein the at least one amorphizing ion species comprises one or more species selected from the group consisting of Si and Ge.

23. The method of claim 22, further comprising the step of treating the irradiated semiconductor substrate at an elevated temperature to at least partially restore crystallinity in the irradiated portions of the semiconductor substrate.

24. The method of claim 22, further comprising the step of treating the irradiated semiconductor substrate at an elevated temperature to at least partially activate dopant atom species in the irradiated portions of the semiconductor substrate.

25. The method of claim 23, wherein the elevated temperature is less than about 600 degrees C.

26. The method of claim 24, wherein the elevated temperature is less than about 600 degrees C.

27. A method for redistributing the dopant atoms in a doped semiconductor region at or near the surface of a semiconductor substrate, the dopant atoms having an initially peaked concentration distribution, comprising the steps of:
maintaining a reduced-pressure environment around a substrate holder for holding
a semiconductor substrate having a doped region at or near a surface of the semiconductor substrate;
holding the semiconductor substrate securely within said reduced-pressure environment;
providing to said reduced-pressure environment a gas-cluster ion beam formed from a pressurized gas including at least one noble gas;
accelerating the gas-cluster ion beam;
irradiating the accelerated gas cluster ion beam onto one or more portions of the doped semiconductor regions at or near the surface of the semiconductor substrate so as to redistribute dopant atoms in the doped semiconductor region.

28. The method of claim 27, wherein the providing step further comprises the steps of:
delivering the pressurized gas mixture to an expansion nozzle;
flowing the pressurized gas mixture through the expansion nozzle into the reduced-pressure environment to form a jet containing gas-clusters; and
ionizing at least a portion of the gas-clusters to form the gas-cluster ion beam.

29. The method of claim 27, wherein the redistributing step at least partially flail ens the initially peaked concentration distribution.

30. The method of claim 27, wherein the redistributing step lowers the peak value of the initially peaked concentration distribution and broadens the distribution peak.

31. A semiconductor junction formed at least in part by the method of claim 1.

32. A semiconductor junction formed at least in part by the method of claim 5.

33. A semiconductor junction formed at least in part by the method of claim 19.

34. A semiconductor junction formed at least in part by the method of claim 21.

35. A semiconductor junction formed at least in part by the method of claim 27.

36. A method for re-crystallizing a damaged semiconductor thin film at the surface of a substantially crystalline semiconductor substrate, comprising the steps of:
providing a reduced pressure vacuum chamber containing a substrate holder for holding the substantially crystalline semiconductor substrate;
holding the substantially crystalline semiconductor substrate on said substrate holder within said reduced pressure vacuum chamber;
selecting an energy for gas cluster ion processing;
generating a gas cluster ion beam within said reduced pressure vacuum chamber;
accelerating the gas cluster ion beam to said selected energy; and
directing the accelerated gas cluster ion beam onto and within at least a portion of
the damaged semiconductor thin film to process the film to reduce the amount of damage and improve the crystallinity thereof.

37. The method of claim 36, wherein the workpiece is a semiconductor substrate from an ion irradiation process of a type causing radiation damage to the thin film.

38. The method of claim 37, wherein the ion irradiation process is ion implantation using molecular or atomic ions.

39. The method of claim 36, wherein the step of selecting an energy further comprises the step of determining a depth for reducing damage and improving crystallinity, said depth being less than about 200 angstroms, and wherein the beam is directed to a level within the film consistent with each determination.

40. The method of claim 36, wherein the directing step farther comprises controllably scanning the accelerated cluster ion beam.

41. A method for electrically activating dopant atoms in a doped semiconductor thin film overlying the surface of a substantially crystalline semiconductor substrate, comprising the steps of:
providing a reduced pressure vacuum chamber containing a substrate holder for holding the substantially crystalline semiconductor substrate;
holding the substantially crystalline semiconductor substrate on said substrate holder within said reduced pressure vacuum chamber;
selecting an energy for gas cluster ion processing;
generating a gas cluster ion beam within said reduced pressure vacuum chamber;
accelerating the gas cluster ion beam to said selected energy; and
directing the accelerated gas cluster ion beam onto and within at least a portion of the doped semiconductor thin film so as to electrically activate at least a portion of the dopant atoms.

42. The method of claim 41, further comprising the step of receiving the semiconductor substrate from a molecular or atomic ion implantation process for doping the semiconductor thin film with the dopant atoms.

43. The method of claim 41, wherein the step of selecting an energy farther comprises the step of determining a depth for electrically activating said at least a portion of the dopant atoms, said depth being less than about 200 angstroms.

44. The method of claim 41, wherein the directing step further comprises controllably scanning the accelerated cluster ion beam.

45. A method of forming a doped ultra-shallow subsurface region of a semiconductor substrate, comprising the steps of:
providing a reduced pressure vacuum chamber containing a substrate holder for holding the semiconductor substrate;
holding the semiconductor substrate on said substrate holder within said reduced pressure vacuum chamber;
selecting a ratio of dopant to non-dopant gas molecules or atoms;
selecting an energy for gas cluster ion processing;
selecting a dose for gas cluster ion processing;
generating, within said reduced pressure vacuum chamber, a gas cluster ion beam comprising dopant and non-dopant molecules or atoms in approximately the selected ratio;
accelerating the gas cluster ion beam to said selected energy; and
directing the accelerated gas cluster ion beam onto a portion of the surface of the semiconductor substrate so as to irradiate the portion of the surface of the semiconductor substrate with approximately the selected dose of dopant molecules or atoms to form a doped ultra-shallow subsurface region.

46. The method of claim 45, wherein the step of selecting an energy further comprises the step of determining a depth for the ultra-shallow subsurface region, said depth being less than about 200 angstroms.

47. The method of claim 45, wherein the selected ratio is in the range of from about 1:10,000 to about 1:1.

48. The method of claim 45, wherein the dopant in the irradiated portion of the semiconductor substrate is at least partially electrically activated.

49. The method of claim 45, wherein the directing step further comprises controllably scanning the accelerated cluster ion beam.

50. A semiconductor device formed in part by the method of claim 36.

51. A semiconductor device formed in part by the method of claim 41.

52. A semiconductor device formed in part by the method of claim 45.

* * * * *